(12) United States Patent
Lin

(10) Patent No.: US 11,360,376 B2
(45) Date of Patent: Jun. 14, 2022

(54) EXTREME ULTRAVIOLET MASK AND METHOD FOR FORMING THE SAME

(71) Applicant: Taiwan Semiconductor Manufacturing Co., Ltd., Hsinchu (TW)

(72) Inventor: Yun-Yue Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 174 days.

(21) Appl. No.: 16/889,604

(22) Filed: Jun. 1, 2020

(65) Prior Publication Data

US 2021/0063865 A1    Mar. 4, 2021

Related U.S. Application Data

(60) Provisional application No. 62/893,753, filed on Aug. 29, 2019.

(51) Int. Cl.
*G03F 1/24* (2012.01)

(52) U.S. Cl.
CPC ..................... *G03F 1/24* (2013.01)

(58) Field of Classification Search
CPC ........................................... G03F 1/24
USPC ............................................. 430/5
See application file for complete search history.

(56) References Cited

U.S. PATENT DOCUMENTS 11,086,215 B2 * 8/2021 Lin .................... G03F 7/70033

* cited by examiner

*Primary Examiner* — Christopher G Young
(74) *Attorney, Agent, or Firm* — Seed IP Law Group LLP

(57) ABSTRACT

A photolithography mask includes a substrate, a reflective multilayer structure over the substrate, an adhesion layer over the reflective multilayer structure, a capping layer over the adhesion layer, and a patterned absorber layer over the capping layer. The capping layer includes a non-crystalline conductive material.

20 Claims, 10 Drawing Sheets

EXTREME ULTRAVIOLET MASK AND METHOD FOR FORMING THE SAME

PRIORITY CLAIM AND CROSS-REFERENCE

This application claims the benefit of U.S. Provisional Patent Application No. 62/893,753, filed Aug. 29, 2019, which is incorporated by reference herein in its entirety.

BACKGROUND

The semiconductor industry has experienced exponential growth. Technological advances in materials and design have produced generations of integrated circuits (ICs), where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
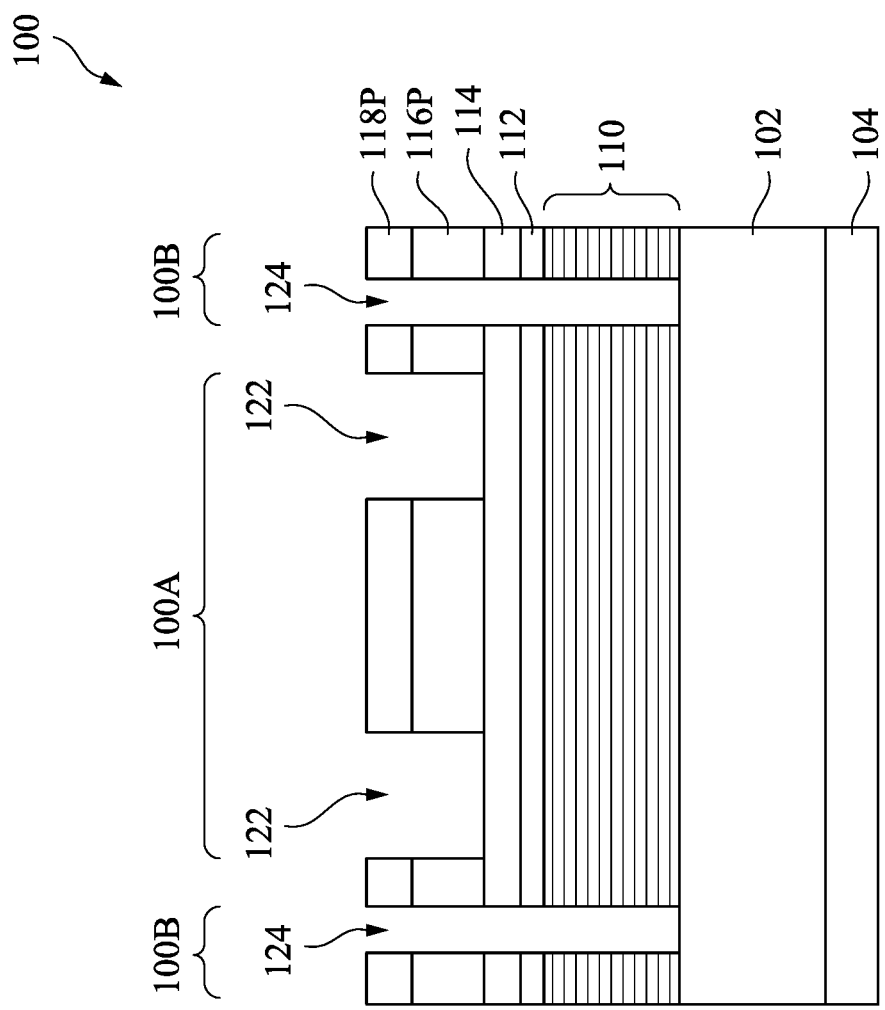
FIG. 1 is a cross-sectional view of an extreme ultraviolet (EUV) mask, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the manufacture of integrated circuits (ICs), patterns representing different layers of the ICs are fabricated using a series of reusable photomasks (also referred to herein as photolithography masks or masks) in order to transfer the design of each layer of the ICs onto a semiconductor substrate during the semiconductor device fabrication process. Thus, any defects in the mask may be transferred to the ICs, potentially severely affecting the device performance. Defects that are severe enough may render the mask completely useless, which increases the cost and production time.

With the shrinkage in IC size, extreme ultraviolet (EUV) light with a wavelength of 13.5 nm is employed in, for example, a lithographic process to enable transfer of very small patterns (e.g., nanometer-scale patterns) from a mask to a semiconductor wafer. Because most materials are highly absorbing at the wavelength of 13.5 nm, EUV lithography utilizes a reflective-type mask which selectively reflects and absorbs EUV radiation. A pattern formed on an EUV mask is transferred to a semiconductor wafer by reflecting EUV light off portions of a reflective surface of the EUV mask. It is important that the EUV mask must be as defect free as possible because the lithography patterning is more sensitive to the mask defects for small feature sizes in the advanced technology nodes.

In some embodiments, a reflective-type EUV mask includes a mask substrate, a reflective multilayer structure comprising alternatively stacked molybdenum (Mo) layers and silicon (Si) layers over the mask substrate, and a patterned absorber layer over the reflective multilayer structure. A ruthenium (Ru) capping layer is disposed over the reflective multilayer structure to prevent oxidation of the top Si layer in the reflective multilayer structure. However, during deposition of Ru onto the reflective multilayer structure, Ru metal tends to crystalize on the surface of the top Si layer and/or intermix with Si at the interface of the Ru capping layer and the top Si layer, resulting in a non-continuous coverage of the Ru capping layer on the top Si layer. The non-continuous Ru capping layer leads to degraded critical dimension (CD) uniformity when the EUV mask is used in the IC fabrication, which in turn reduces the performance of ICs. Additionally, carbon from the metal organic precursor residues in the EUV exposure tool may diffuse into the Ru capping layer and accumulate in the surface portion of the Ru capping layer. Over time, the carbon contaminants result in a significant reflectivity drop of the EUV mask, which adversely affects the performance of the EUV mask.

In embodiments of the present disclosure, an EUV mask with improved quality and stability is provided. The EUV mask includes a substrate, a reflective multilayer (ML) structure over the substrate, an adhesion layer over the reflective ML structure, a Ru-based capping layer over the adhesion layer, a patterned absorber layer over the capping layer, and a patterned anti-reflection layer over the patterned absorber layer. The adhesion layer introduced between the reflective multilayer structure and the Ru-based capping layer helps to prevent the crystallization of Ru when Ru is deposited onto the reflective multilayer structure. As a result, a capping layer with a continuous coverage across the reflective multilayer structure is able to be obtained. The adhesion layer also helps to prevent Ru—Si intermixing during the use of the EUV mask, thereby helping to improve stability of the EUV mask. In some embodiments, the Ru-based capping layer is further doped with dopants with lower carbon solubility than Ru. As a result, the accumulation of carbon in the surface portion of the Ru-based capping layer is reduced during the use of the EUV mask, which leads to further increase the stability of the EUV mask.

FIG. 1 is a cross-sectional view of an EUV mask 100, in accordance with some embodiments of the present disclosure. Referring to FIG. 1, the EUV mask 100 includes a substrate 102, a reflective multilayer structure 110 over a front surface of the substrate 102, an adhesion layer 112 over the reflective multilayer structure 110, a capping layer 114 over the adhesion layer 112, a patterned absorber layer 116P over the capping layer 114, and a patterned anti-reflection layer 118P over the patterned absorber layer 116P. The EUV mask 100 further includes a conductive layer 104 over a back surface of the substrate 102 opposite the front surface.

The patterned absorber layer 116P and the patterned anti-reflection layer 118P contain a pattern of openings 122 that correspond to circuit patterns to be formed on a semiconductor wafer. The pattern of openings 122 is located in a pattern region 100A of the EUV mask 100, exposing a surface of the capping layer 114. The pattern region 100A is surrounded by a peripheral region 100B of the EUV mask 100. The peripheral region 100B corresponds to a non-patterned region of the EUV mask 100 that is not used in an exposing process during IC fabrication. In some embodiments, the pattern region 100A of EUV mask 100 is located at a central region of the substrate 102, and the peripheral region 100B is located at an edge portion of the substrate 102. The pattern region 100A is separated from the peripheral region 100B by trenches 124. The trenches 124 extend through the patterned anti-reflection layer 118P, the patterned absorber layer 116P, the capping layer 114, the adhesion layer 112, and the reflective multilayer stack 110, exposing the front surfaced of the substrate 102.

In the present disclosure, by introducing an adhesion layer 112 between the capping layer 114 and the reflective multilayer structure 110 to enhance the uniformity of the capping layer 114 and to reduce the carbon accumulation during the use of the EUV mask 100, the quality and the stability of the EUV mask 100 are enhanced.

Figure 2:
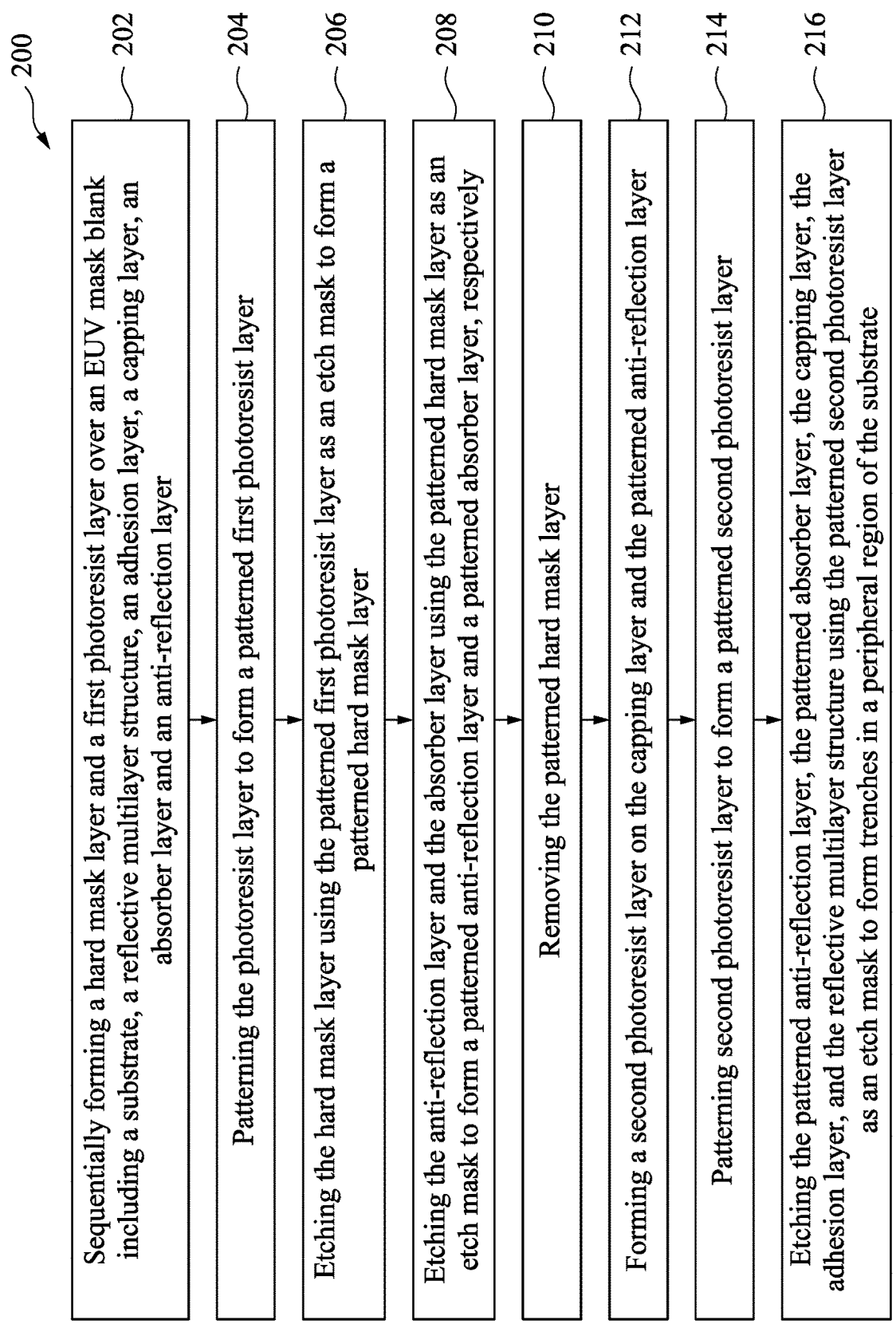
FIG. 2 is a flowchart of a method for fabricating an EUV mask, in accordance with some embodiments.

FIG. 2 is a flowchart of a method 200 for fabricating an EUV mask, for example, EUV mask 100, in accordance with some embodiments. FIG. 3A through FIG. 3H are cross-sectional views of the EUV mask 100 at various stages of the fabrication process, in accordance with some embodiments. The method 200 is discussed in detail below, with reference to the EUV mask 100. In some embodiments, additional operations are performed before, during, and/or after the method 200, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 3A:
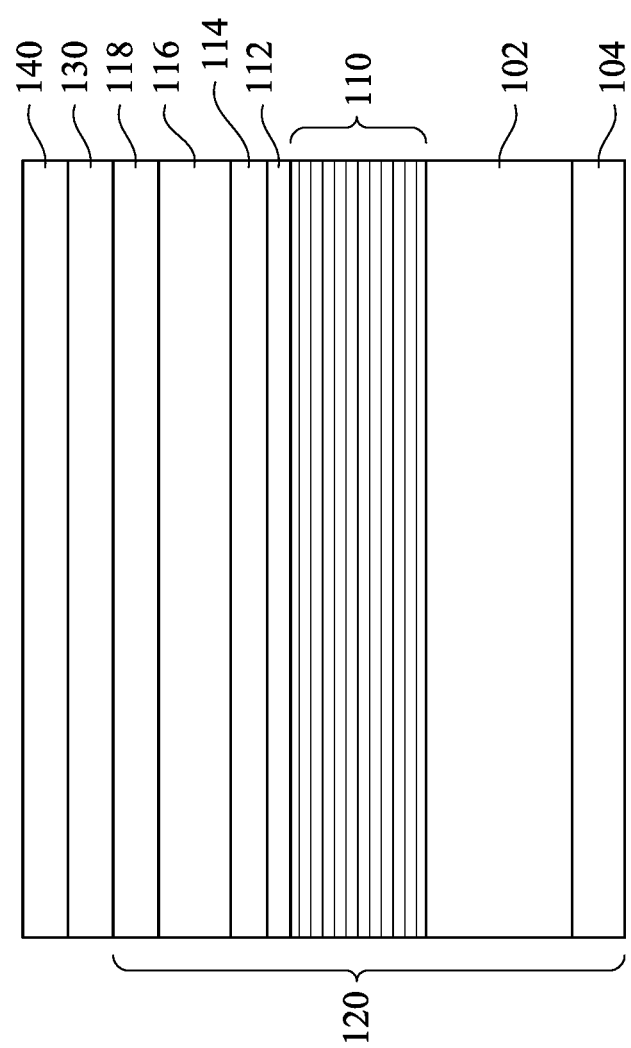
FIGS. 3A-3H are cross-sectional views of an EUV mask at various stages of a fabrication process, in accordance with some embodiments.

Referring to FIGS. 2 and 3A, the method 200 includes operation 202, in which a hard mask layer 130 and a photoresist layer 140 are sequentially formed over an EUV mask blank 120, in accordance with some embodiments. In some embodiments, the EUV mask blank 120 includes, from bottom to top, a substrate 102, a reflective multilayer structure 110, an adhesion layer 112, a capping layer 114, an absorber layer 116, and an anti-reflection layer 118.

The substrate 102 includes a material with a low thermal expansion coefficient. The low thermal expansion material helps to minimize image distortion due to mask heating during use of the EUV mask 100. In some embodiments, the substrate 102 includes fused silica, fused quartz, calcium fluoride, silicon carbide, black diamond, titanium oxide doped silicon oxide ($SiO_2/TiO_2$), or other suitable low thermal expansion materials. In some embodiments, the substrate 102 has a thickness ranging from about 1 mm to about 7 mm. If the thickness of the substrate 102 is too small, a risk of breakage or warping of the EUV mask 100 increases, in some instances. On the other hand, if the thickness of the substrate is too great, a weight of the EUV mask 100 is needlessly increased, in some instances.

In some embodiments, a conductive layer 104 is disposed on a back surface of the substrate 102. In some embodiments, the conductive layer 104 is in direct contact with the back surface of the substrate 102. The conductive layer 104 is operable to provide for electrostatically coupling of the EUV mask 100 to an electrostatic mask chuck (not shown) during fabrication and use of the EUV mask 100. In some embodiments, the conductive layer 104 includes chromium nitride (CrN). In some embodiments, the conductive layer 104 is formed by a deposition process such as, for example, chemical vapor deposition (CVD), plasma-enhanced chemical vapor deposition (PECVD), or physical vapor deposition (PVD). The thickness of the conductive layer 104 is controlled such that the conductive layer 104 is optically transparent.

The reflective multilayer structure 110 is disposed over a front surface of the substrate 102 opposite the back surface. In some embodiments, the reflective multilayer structure is in directly contact with the front surface of the substrate 102. The reflective multilayer structure 110 provides a high reflectivity to the EUV light. In some embodiments, the reflective multilayer structure 110 is configured to achieve about 60% to about 75% reflectivity at the peak EUV illumination wavelength. In some embodiments, the reflective multilayer structure 110 includes alternatively stacked layers of a high refractive index material and a low refractive index material. A material having a high refractive index has a tendency to scatter EUV light and on the other hand, a material having a low refractive index has a tendency to transmit EUV light. Pairing these two type materials together provides a resonant reflectivity. In some embodiments, the reflective multilayer structure 110 includes alternatively stacked layers of molybdenum (Mo) and silicon (Si). In some embodiments, the reflective multilayer structure 110 includes alternatively stacked Mo and Si layers with Si being in the top layer. In some embodiments, a molybdenum layer is in direct contact with the front surface of the substrate 102. In other some embodiments, a silicon layer is in direct contact with the front surface of the substrate 102. Alternatively, the reflective multilayer structure 110 includes alternatively stacked layers of Mo and beryllium (Be).

The thickness of each layer in the reflective multilayer structure 110 depends on the EUV wavelength and the incident angle. The thickness of alternating layers in the reflective multilayer structure 110 is tuned to maximize the constructive interference of the EUV light reflected at each interface and to minimize the overall absorption of the EUV light. In some embodiments, the reflective multilayer structure 110 has a thickness ranging from about 250 nm to about 350 nm. In some embodiments, the reflective multilayer structure 110 includes forty (40) pairs of alternating layers of Mo and Si. Each Mo/Si pair has a thickness of about 5 nm to about 7 nm, with a total thickness of about 300 nm.

In some embodiments, each layer in the reflective multilayer structure 110 is deposited over the substrate 102 and underlying layer using ion beam deposition (IBD) or DC magnetron sputtering. The deposition method used helps to ensure the thickness uniformity of the reflective multilayer structure 110 is better than about 0.85 across the substrate 102.

The adhesion layer 112 is disposed over the reflective multilayer structure 110. In some embodiments, the adhesion layer 112 is in direct contact with the topmost surface of the reflective multilayer structure 110. The adhesion layer 112 provides good adhesion for the capping layer 114 subsequently formed thereon. The adhesion layer 112, thus helps to prevent or reduce self-crystallization of the capping layer 114 during the deposition of the material that provides the capping layer 114, rendering the capping layer 114 formed there on amorphous or semi-crystalline. The adhesion layer 112 also acts as a barrier layer, preventing the intermixing of the metal in the capping layer 114 and silicon in top silicon layer of the reflective multilayer structure 110 during the use of the EUV mask 100. As a result, the stability of the EUV mask 100 is improved.

In some embodiments, the adhesion layer 112 includes or is made of a dielectric material such as, for example, silicon oxide, silicon oxynitride, silicon nitride, or a combination thereof. In some embodiments, the adhesion layer 112 is formed using a deposition process such as, for example, CVD, PECVD, PVD, or atomic layer deposition (ALD). In some embodiments, the adhesion layer 112 is formed by conversion of a surface portion of the Si top layer in the reflective multilayer structure 110 using oxidation and/or nitridation. In some embodiments, the adhesion layer 112 includes silicon oxide and is formed by conversion of a surface portion of the Si top layer using a thermal oxidation process or a plasma oxidation process.

The thickness of the adhesion layer 112 is controlled to ensure that a continuous coverage of the adhesion layer 112 on the underlying reflective multilayer structure 110 is obtained. In some embodiment, the adhesion layer 112 has a thickness raging from about 1 nm to about 3 nm. If the thickness of the adhesion layer 112 is too small, a continuous coverage of the adhesion layer 112 cannot be obtained, in some instances. In such case, the capping layer material can still be deposited directly on the surface of the reflective multilayer structure 110, and the crystallization of the capping layer material and/or intermixing of the capping layer material and silicon can occur in regions where the reflective multilayer structure 110 not covered by the adhesion layer 112. The crystallization of the capping layer material and/or intermixing of the capping layer material and silicon reduce the uniformity of the capping layer 114, which adversely affects the quality of the EUV mask 100. On the other hand, if the thickness of the adhesion layer 112 is too large, a great decrease in the reflectivity of the reflective multilayer structure 110 occurs, which leads to critical dimension (CD) errors in the lithography processes, in some instances.

The capping layer 114 is disposed over the adhesion layer 112. In some embodiments, the capping layer 114 is in direct contact with a top surface of the adhesion layer 112. The capping layer 114 helps to prevent oxidation of the top Si layer in the reflective multilayer structure 110 during the fabrication and use of the EUV mask 100. In the present disclosure, because the capping layer 114 is deposited on the adhesion layer 112 which provides stronger bonding to the capping layer 114 compared to instances where the capping layer 114 is directly deposited onto the reflective multilayer structure 110, the presence of the adhesion layer 112 helps to prevent self-crystallization of the capping layer material, which results in massive grain boundaries and defect areas. The resulting capping layer 114 has an amorphous or a semi-crystalline structure. The capping layer 114, thus, has a smoother surface than the crystalline counterpart, which helps to improve the uniformity of the capping layer 114.

In some embodiments, the capping layer 114 includes a material that resists oxidation and corrosion, and has a low chemical reactivity with common atmospheric gas species such as oxygen, nitrogen, and water vapor. In some embodiments, the capping layer 114 includes a transition metal such as, for example, Ru, iridium (Ir), Rhodium (Rh), platinum (Pt), palladium (Pd), osmium (Os), rhenium (Re), vanadium (V), Tantalum (Ta), hafnium (Hf), tungsten (W), molybdenum (Mo), zirconium (Zr), manganese (Mn), or technetium (Tc).

In some embodiments, the capping layer 114 further includes one or more dopants having a carbon solubility less than a carbon solubility of the material providing the capping layer 114. In some embodiments, the dopant has a carbon solubility less than that of the transition metal providing the capping layer 114. Exemplary dopants include, but are not limited to, niobium (Nb), titanium (Ti), zirconium (Zr), yttrium (Y), boron (B), and phosphorus (P). Introducing dopants into the capping layer 114 helps to prevent the accumulation of carbon in the capping layer 114 during the use of the EUV mask 100, which improves the long term stability of the EUV mask 100. The amount of the dopants in the capping layer 114 is controlled to prevent the formation of intermetallic compounds of two metals, which reduces uniformity of the capping layer 114. In some embodiments, the ratio of Ru and dopant element is controlled in a range from about 1:0 to about 2:1. In some embodiments, the concentration of dopants in the capping layer 114 is less than about 50 atomic percent (at. %). Because dopant elements normally have a density less than the density of Ru, if dopants are introduced into the capping layer 114, the density of the resulting capping layer 114 is less than the bulk density of Ru (e.g., about 12.45 g/cm$^3$).

In some embodiments, the capping layer 114 is formed using a deposition process such as, for example, IBD, CVD, PVD, or ALD. In some embodiments, the dopants are introduced into the capping layer 114 by ion implantation after the capping layer 114 is formed. In some embodiments, the dopants are co-deposited with the material providing the capping layer 114.

The absorber layer 116 is disposed over the capping layer 114. In some embodiments, the absorber layer 116 is in direct contact with a top surface of the capping layer 114. The absorber layer 116 includes a material having a high absorption coefficient in EUV wavelengths. In some embodiments, the absorber layer 116 includes a material having a high absorption coefficient at 13.5 nm wavelength. In some embodiments, the absorber layer 116 includes or is made of chromium (Cr), chromium oxide (CrO), titanium nitride (TiN), tantalum nitride (TaN), tantalum (Ta), titanium (Ti), Mo, aluminum-copper (Al—Cu), palladium (Pd), tantalum boron nitride (TaBN), tantalum boron oxide (TaBO), aluminum oxide ($Al_2O_3$), silver oxide ($Ag_2O$), or a combination thereof. In some embodiments, the absorber layer 116 has a single layer structure. In some other embodiments, the absorber layer 116 has a multilayer structure. In some embodiments, the absorber layer 116 is formed by a deposition process such as, for example, CVD, PECVD, PVD, or ALD.

The anti-reflection layer 118 is disposed over the absorber layer 116. In some embodiments, the anti-reflection layer 118 is in direct contact with a top surface of the absorber layer 116. The anti-reflection layer 118 reduces reflection of light from underlying layers during the lithography patterning of the photoresist layer 140 and thus helps to increase the precision of patterns formed in the photoresist layer 140. In some embodiments, the anti-reflection layer 118 includes a metal oxide such as tantalum oxide (TaO) or tantalum boron oxide (TaBO), a metal such as Ru, Ti, Niobium (Nb), Zirconium (Zr), hafnium (Hf), platinum (Pt) or iridium (Ir). In some embodiments, the anti-reflection layer 118 is formed using a deposition process such as, for example, CVD, PECVD, or PVD.

The hard mask layer 130 is disposed over the anti-reflection layer 118. In some embodiments, the hard mask layer 130 is in direct contact with the anti-reflection layer 118. In some embodiments, the hard mask layer 130 includes a dielectric oxide such as silicon dioxide or a dielectric nitride such as silicon nitride. In some embodiments, the hard mask layer 130 is formed using a deposition process such as, for example, CVD, PECVD, or PVD.

The photoresist layer 140 is disposed over the hard mask layer 130. The photoresist layer 140 includes a photosensitive material operable to be patterned by radiation. In some embodiments, the photoresist layer 140 includes a positive-tone photoresist material, a negative-tone photoresist material or a hybrid-tone photoresist material. In some embodiments, the photoresist layer 140 is applied to the surface of the hard mask layer 130 by a deposition process, such as spin coating.

Figure 3B:
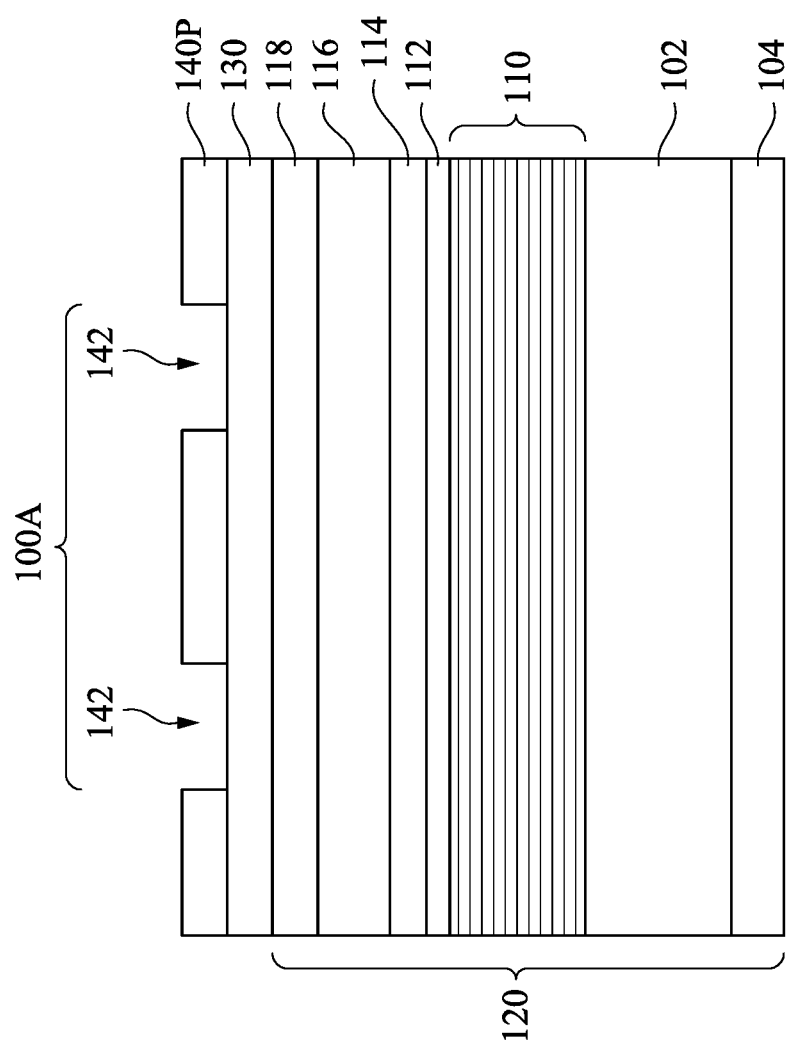

Referring to FIGS. 2 and 3B, the method 200 proceeds to operation 204, in which the photoresist layer 140 is patterned to form a patterned photoresist layer 140P, in accordance with some embodiments. The photoresist layer 140 is patterned by first subjecting the photoresist layer 140 to a pattern of irradiation. Next, the exposed or unexposed portions of the photoresist layer 140 are removed depending on whether a positive-tone or negative-tone resist is used in the photoresist layer 140 with a resist developer, thereby forming the patterned photoresist layer 140P having a pattern of openings 142 formed therein. The openings 142 expose portions of the hard mask layer 130. The openings 142 are located in the pattern region 100A and correspond to locations where the pattern of openings 122 are present in the EUV mask 100 (FIG. 1).

Figure 3C:
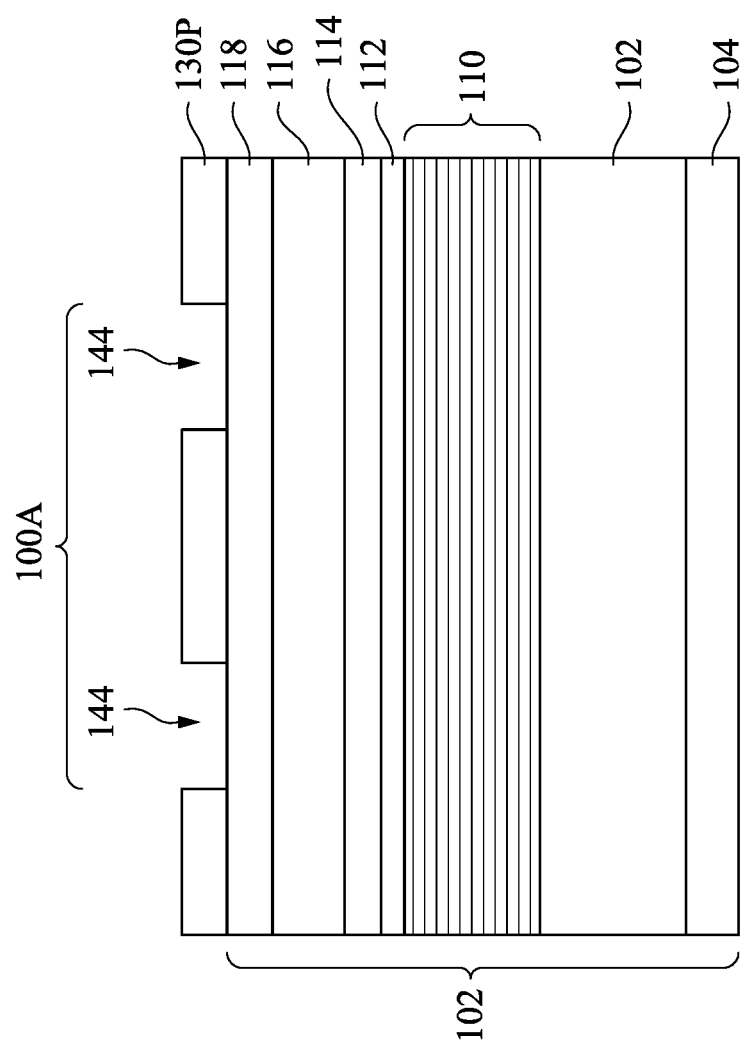

Referring to FIGS. 2 and 3C, the method 200 proceeds to operation 206, in which the hard mask layer 130 is etched using the patterned photoresist layer 140P as an etch mask to form a patterned hard mask layer 130P, in accordance with some embodiments. Portions of the hard mask layer 130 that are exposed by the openings 142 are etched to form openings 144 extending through the hard mask layer 130. The openings 144 expose portions of the anti-reflection layer 118. In some embodiments, the hard mask layer 130 is etched using an anisotropic etch. In some embodiments, the anisotropic etch is a dry etch such as, for example, reactive ion etch (ME), a wet etch, or a combination thereof. The etch removes the material providing the hard mask layer 130 selective to the material providing the anti-reflection layer 118. The remaining portions of the hard mask layer 130 constitute the patterned hard mask layer 130P. If not completely consumed during the etching of the hard mask layer 130, after etching the hard mask layer 130, the patterned photoresist layer 140P is removed from the surface of the patterned hard mask layer 130P, for example, using wet stripping or plasma ashing.

Figure 3D:
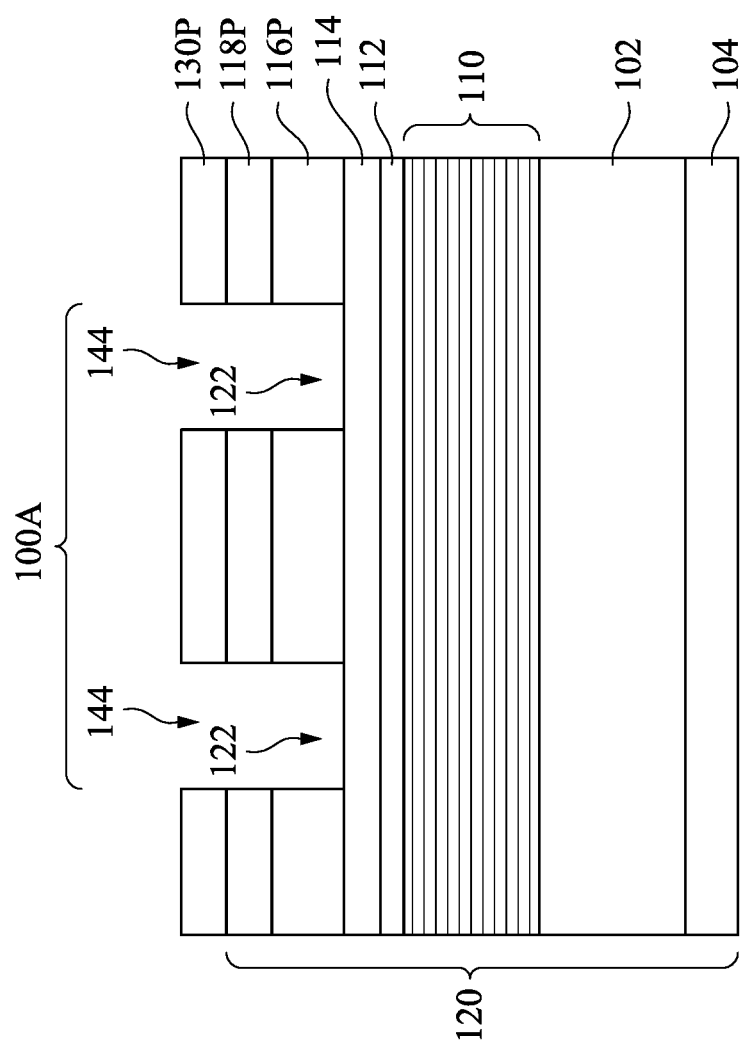

Referring to FIGS. 2 and 3D, the method 200 proceeds to operation 208, in which the anti-reflection layer 118 and the absorber layer 116 are etched using the patterned hard mask layer 130P as an etch mask to form a patterned anti-reflection layer 118P and a patterned absorber layer 116P, respectively, in accordance with some embodiments. Portions of the anti-reflection layer 118 that are exposed by the openings 144 and portions of the absorber layer 116 that underlie the exposed portions of the anti-reflection layer 118 are etched to form openings 122 extending through the anti-reflection layer 118 and the absorber layer 116. The openings 122 are in the pattern region 100A of the EUV mask 100 and correspond to circuit patterns formed on a semiconductor wafer. The openings 122 expose portions of the capping layer 114. In some embodiments, the anti-reflection layer 118 and the absorber layer 116 are etched using a single anisotropic etching process. In some embodiments, the anisotropic etch is a dry etch such as, for example, ME, a wet etch, or a combination thereof that removes the material providing the anti-reflection layer 118 and the material providing the absorber layer 116 selective to the material providing the capping layer 114. In some embodiments, the anti-reflection layer 118 and the absorber layer 116 are etched using two different anisotropic etching processes. Each anisotropic etch can be a dry etch such as, for example, RIE, a wet etch, or a combination thereof. The first etch removes the material providing the anti-reflection layer 118 selective to the material providing the absorber layer 116, and the second etch removes the material providing the absorber layer 116 selective to the material providing the capping layer 114. The remaining portions of the anti-reflection layer 118 constitute the patterned anti-reflection layer 118P. The remaining portions of the absorber layer 116 constitute the patterned absorber layer 116P.

Figure 3E:
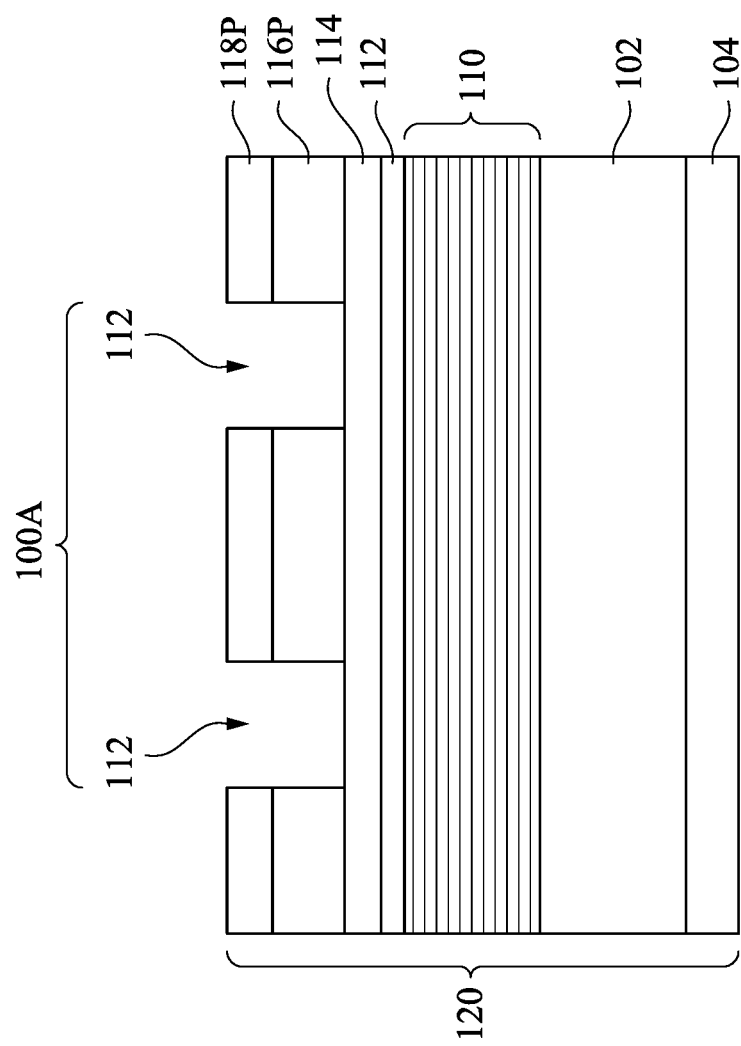

Referring to FIGS. 2 and 3E, the method 200 proceeds to operation 210, in which the patterned hard mask layer 130P is removed, in accordance with some embodiments. In some embodiments, the patterned hard mask layer 130P is removed from the surfaces of the patterned anti-reflection layer 118P, for example, using oxygen plasma or a wet etch.

Figure 3F:
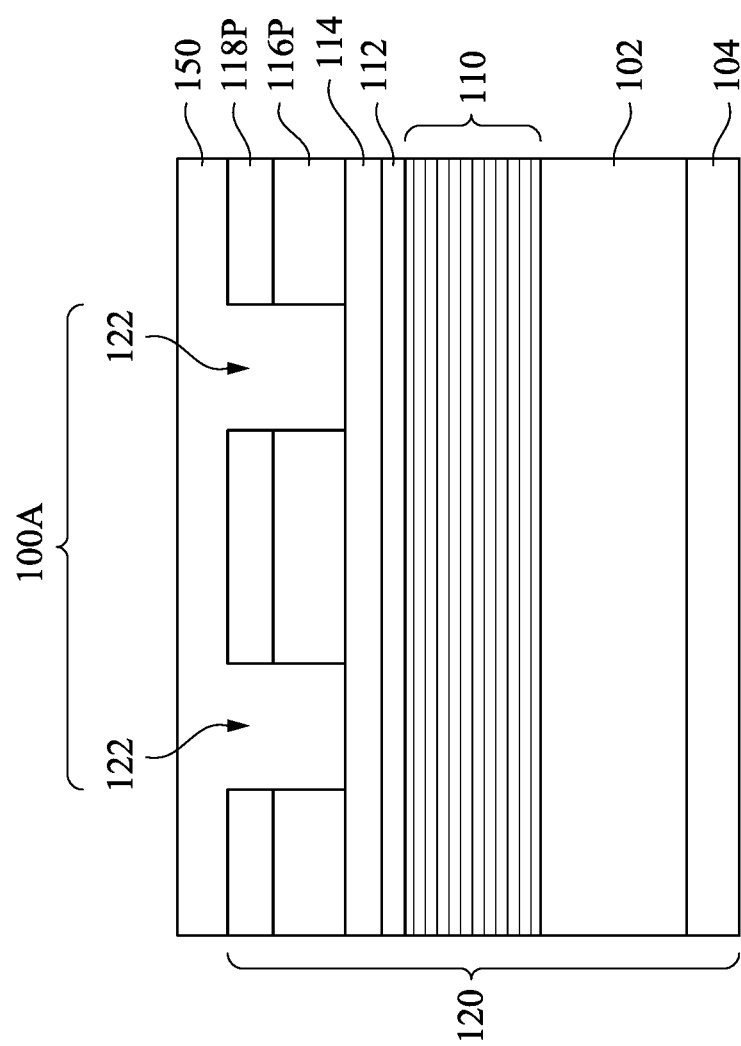

Referring to FIGS. 2 and 3F, the method 200 proceeds to operation 212, in which a photoresist layer 150 is formed on the capping layer 114 and the patterned anti-reflection layer 118P, in accordance with some embodiments. The photoresist layer 150 fills the openings 122 in the pattern region 100A of the substrate 102. In some embodiments, the photoresist layer 150 includes a positive-tone photoresist material, a negative-tone photoresist material or a hybrid-tone photoresist material. In some embodiments, the photoresist layer 150 includes a same material as the photoresist layer 140 described above in FIG. 3A. In some embodiments, the photoresist layer 150 includes a different material from the photoresist layer 140. In some embodiments, the photoresist layer 150 is formed, for example, by spin coating.

Figure 3G:
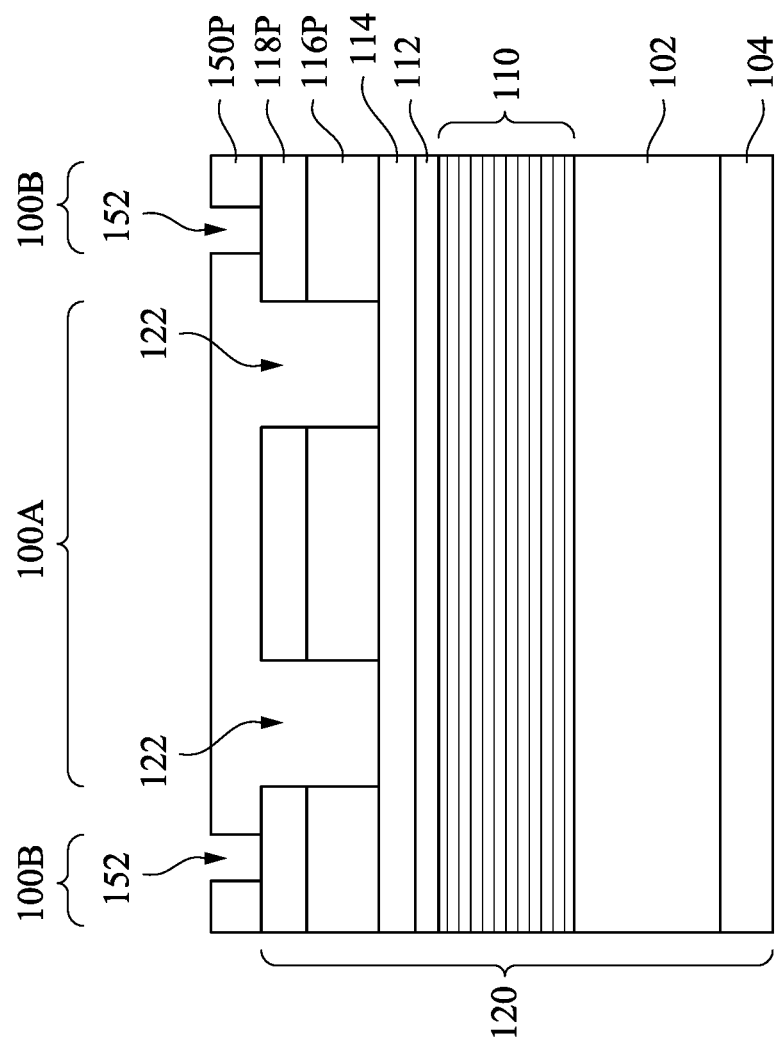

Referring to FIGS. 2 and 3G, the method 200 proceeds to operation 214, in which the photoresist layer 150 is patterned to form a patterned photoresist layer 150P containing a pattern of openings 152 therein, in accordance with some embodiments. The openings 152 expose portions of the anti-reflection layer 118P where trenches 124 in the peripheral region 100B of the EUV mask 100 are to be formed. In some embodiments, the photoresist layer 150 is patterned by exposing the photoresist layer 150 to a pattern of radiation, and removing the exposed or unexposed portions of the photoresist layer 150 using a resist developer depending on whether a positive or negative resist is used. The remaining portions of the photoresist layer 150 constitute the patterned photoresist layer 150P.

Figure 3H:
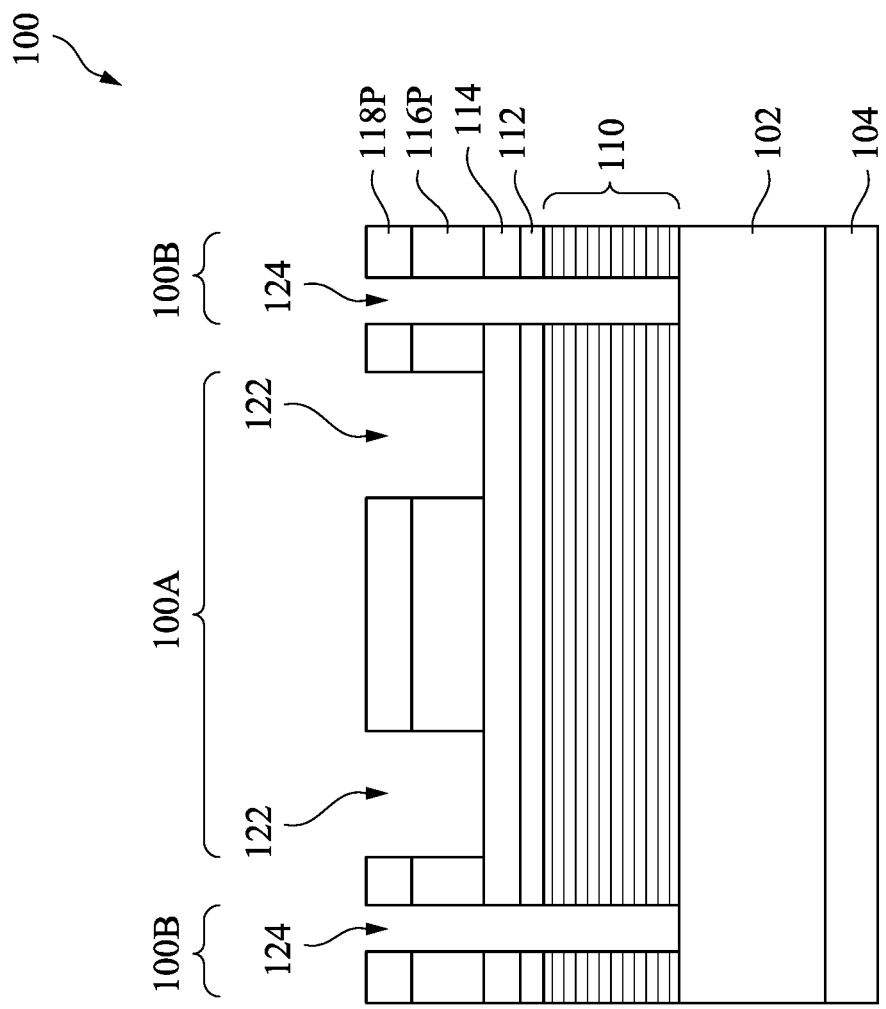

Referring to FIGS. 2 and 3H, the method 200 proceeds to operation 216, in which the patterned anti-reflection layer 118P, the patterned absorber layer 116P, the capping layer 114, the adhesion layer 112, and the reflective multilayer structure 110 are etched using the patterned photoresist layer 150P as an etch mask to form trenches 124 in the peripheral region 100B of the substrate 102, in accordance with some embodiments. In some embodiments, the trenches 124 extend into the reflective multilayer structure 110. In some embodiments, the trenches 124 expose the surface of the substrate 102.

In some embodiments, the patterned anti-reflection layer 118P, the patterned absorber layer 116P, the capping layer 114, the adhesion layer 112, and the reflective multilayer structure 110 are etched using a single anisotropic etching process. The anisotropic etch can be a dry etch such as, for example, ME, a wet etch, or a combination thereof that removes materials of respective patterned anti-reflection layer 118P, the patterned absorber layer 116P, the capping layer 114, the adhesion layer 112, and the reflective multilayer structure 110 selective to the material providing the substrate 102. In some embodiments, the patterned anti-reflection layer 118P, the patterned absorber layer 116P, the capping layer 114, the adhesion layer 112, and the reflective multilayer structure 110 are etched using multiple distinct anisotropic etching processes. Each anisotropic etch can be a dry etch such as, for example, RIE, a wet etch, or a combination thereof.

After formation of the trenches 124, the patterned photoresist layer 150P is removed, for example, by wet stripping or plasma ashing. The removal of the patterned photoresist layer 150P re-expose the surface of the substrate 102 in the openings 122.

Many variations and/or modifications can be made to embodiments of the disclosure. In some other embodiments, the reflective multilayer structure 110 is replaced with another reflective structure that has a single-layer structure.

One aspect of this description relates to a photolithography mask. The photolithography mask includes a substrate, a reflective multilayer structure over the substrate, an adhesion layer over the reflective multilayer structure, a capping layer over the adhesion layer, and a patterned absorber layer over the capping layer. The capping layer includes a non-crystalline conductive material Another aspect of this description relates to relates to a photolithography mask. The photolithography mask includes a substrate, a reflective multilayer structure over the substrate, an adhesion layer over the reflective multilayer structure, a capping layer over the adhesion layer, and a patterned absorber layer over the capping layer. The adhesion layer includes a dielectric material, and the capping layer includes an amorphous conductive material.

Still another aspect of this description relates to a method of forming a photolithography mask. The method includes depositing a reflective multilayer structure over a substrate. The method further includes forming an adhesion layer over the reflective multilayer structure. The method further includes depositing a capping layer over the adhesion layer. The capping layer includes an amorphous conductive material. The method further includes depositing an absorber layer over the capping layer. The method further includes etching the absorber layer to form a plurality of openings exposing a surface of the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photolithography mask, comprising:
   a substrate;
   a reflective multilayer structure over the substrate;
   an adhesion layer over the reflective multilayer structure;
   a capping layer over the adhesion layer, the capping layer comprising a non-crystalline conductive material; and
   a patterned absorber layer over the capping layer.

2. The photolithography mask of claim 1, wherein the adhesion layer comprises silicon dioxide, silicon nitride, or silicon oxynitride.

3. The photolithography mask of claim 1, wherein the capping layer comprises amorphous ruthenium (Ru).

4. The photolithography mask of claim 1, wherein the capping layer comprises semi-crystalline Ru.

5. The photolithography mask of claim 1, wherein the capping layer further comprises one or more dopants having a carbon solubility lower than that of the non-crystalline material of the capping layer.

6. The photolithography mask of claim 5, wherein the one or more dopants are selected from the group consisting of niobium (Nb), titanium (Ti), zirconium (Zr), yttrium (Y), boron (B), and phosphorus (P).

7. The photolithography mask of claim 5, wherein a concentration of the one or more dopants in the capping layer is less than 50 atomic %.

8. The photolithography mask of claim 1, wherein the adhesion layer has a thickness from about 1 nm to about 3 nm.

9. The photolithography mask of claim 1, further comprising a patterned anti-reflection layer over the patterned absorber layer.

10. A photolithography mask, comprising:
    a substrate;
    a reflective multilayer structure over the substrate;
    an adhesion layer over the reflective multilayer structure, the adhesion layer comprising a dielectric material;
    a capping layer over the adhesion layer, the capping layer comprising an amorphous conductive material; and
    a patterned absorber layer over the capping layer.

11. The photolithography mask of claim 10, wherein the adhesion layer comprises silicon dioxide, silicon nitride, or silicon oxynitride.

12. The photolithography mask of claim 10, wherein the capping layer comprises amorphous ruthenium.

13. The photolithography mask of claim 10, wherein the capping layer further comprises one or more dopants selected from the group consisting of niobium (Nb), titanium (Ti), zirconium (Zr), yttrium (Y), boron (B), and phosphorus (P).

14. The photolithography mask of claim 10, wherein the reflective multilayer structure comprises alternating layers of molybdenum (Mo) and silicon (Si), wherein a Si layer is a topmost layer in the reflective multilayer structure.

15. The photolithography mask of claim 10, wherein the patterned absorber layer comprises chromium (Cr), chromium oxide (CrO), titanium nitride (TiN), tantalum nitride (TaN), tantalum (Ta), titanium (Ti), Mo, aluminum-copper (Al—Cu), palladium (Pd), tantalum boron nitride (TaBN), aluminum oxide ($Al_2O_3$), or silver oxide ($Ag_2O$).

16. The photolithography mask of claim 10, further comprising a patterned anti-reflection layer over the patterned absorber layer.

17. The photolithography mask of claim 16, wherein the patterned anti-reflection layer comprises tantalum oxide (TaO) or tantalum boron oxide (TaBO).

18. A method of forming a photolithography mask, comprising:
  depositing a reflective multilayer structure over a substrate;
  forming an adhesion layer over the reflective multilayer structure;
  depositing a capping layer over the adhesion layer, the capping layer comprising an amorphous conductive material;
  depositing an absorber layer over the capping layer; and
  etching the absorber layer to form a plurality of openings exposing a surface of the capping layer.

19. The method of claim 18, further comprising etching the absorber layer, the capping layer, and the reflective multilayer structure to form a plurality of trenches in a peripheral region of the substrate surrounding the plurality of openings.

20. The method of claim 18, further comprising doping the capping layer with one or more dopants.

* * * * *